(12) United States Patent
Bai

(10) Patent No.: US 8,390,376 B2
(45) Date of Patent: Mar. 5, 2013

(54) NON-LINEAR MODEL WITH TAP OUTPUT NORMALIZATION

(75) Inventor: Chunlong Bai, Kanata (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 25 days.

(21) Appl. No.: 13/119,160

(22) PCT Filed: Nov. 16, 2010

(86) PCT No.: PCT/IB2010/055193
§ 371 (c)(1),
(2), (4) Date: Mar. 15, 2011

(87) PCT Pub. No.: WO2012/066382
PCT Pub. Date: May 24, 2012

(65) Prior Publication Data
US 2012/0119810 A1 May 17, 2012

(51) Int. Cl.
*H03F 1/26* (2006.01)
(52) U.S. Cl. .......................................... 330/149
(58) Field of Classification Search .................. 330/149; 375/297; 455/114.3
See application file for complete search history.

(56) References Cited

U.S. PATENT DOCUMENTS

| | | | |
|---|---|---|---|
| 6,236,837 B1 | 5/2001 | Midya | |
| 6,240,278 B1 | 5/2001 | Midya et al. | |
| 6,798,843 B1 | 9/2004 | Wright et al. | |
| 7,149,257 B2 | 12/2006 | Braithwaite | |
| 7,295,815 B1 | 11/2007 | Wright et al. | |
| 7,577,211 B2 * | 8/2009 | Braithwaite | .................. 375/296 |
| 2005/0163250 A1 | 7/2005 | McCallister | |
| 2005/0163268 A1 | 7/2005 | McCallister et al. | |
| 2008/0008263 A1 | 1/2008 | Keerthi et al. | |
| 2008/0144709 A1 | 6/2008 | McCallister et al. | |
| 2009/0124218 A1 | 5/2009 | McCallister et al. | |
| 2009/0302940 A1 | 12/2009 | Fuller et al. | |

OTHER PUBLICATIONS

Oh, D. G. et al. "Adaptive Nonlinear Equalizer with Reduced Computational Complexity." Signal Processing Elsevier Science Publishers B.V., Amsterdam, NL, vol. 47, No. 3, Dec. 1, 1995.
Raich, R. et la. "Orthogonal Polynomials for Power Amplifier Modeling and Predistorter Design." IEEE Transactions on Vehicular Technology, vol. 53, No. 5, Sep. 2004.
Badoin, G. et al. "Adaptive Polynomial Pre-Distortion for Linearization of Power Amplifiers in Wireless Communications and WLAN." International Conference on Trends in Communications, Bratislava, Slovakia, 2001.
Li, H. et al. "Nonlinear Least Squares Lattice Algorithm for Identifying the Power Amplifier with Memory Effects." Proceedings of the 2006 Vehicular Technology Conference, May 10, 2006.
Ren, K. et al. "Identification of Memory Polynomial Nonlinear Models for RF Power Amplifiers with a Systolic Array Based QRD-RLS Algorithm." 2008 Asia-Pacific Microwave Conference, Dec. 16, 2008.

* cited by examiner

*Primary Examiner* — Steven J Mottola
(74) *Attorney, Agent, or Firm* — Coats & Bennett, PLLC

(57) ABSTRACT

A distortion model for a predistortion system uses tap output normalization to normalize the variance of data signals generated from different basis functions in a set of basis functions to a predetermined value. The distortion model is used by a distortion modeling circuit to calculate the weighting coefficients for a digital predistorter.

24 Claims, 11 Drawing Sheets

NON-LINEAR MODEL WITH TAP OUTPUT NORMALIZATION

BACKGROUND

The present invention relates generally to techniques for constructing physical models of non-linear electronic devices and, more particularly, to methods and apparatus for compensating an input signal for distortion introduced to the input signal by an electronic device.

The design of radio-frequency power amplifiers for communications applications often involves a trade-off between linearity and efficiency. Power amplifiers are typically most efficient when operated at or near the saturation point. However, the response of the amplifier at or near the point of saturation is non-linear. Generally speaking, when operating in the high-efficiency range, a power amplifier's response exhibits non-linearities and memory effects.

One way to improve a power amplifier's efficiency and its overall linearity is to digitally predistort the input to the power amplifier to compensate for the distortion introduced by the power amplifier. In effect, the input signal is adjusted in anticipation of the distortion to be introduced by the power amplifier, so that the output signal is largely free of distortion products. Generally, the predistortion is applied to the signal digitally, at baseband frequencies, i.e., before the signal is upconverted to radio frequencies.

These techniques can be quite beneficial in improving the overall performance of a transmitter system, in terms of both linearity and efficiency. Furthermore, these techniques can be relatively inexpensive, due to the digital implementation of the predistorter. In fact, with the availability of these techniques, power amplifiers may be designed in view of more relaxed linearity requirements than would otherwise be permissible, thus potentially reducing the costs of the overall system.

SUMMARY

The present invention provides a distortion model for use in a predistortion system. The predistortion system comprises a predistorter, a power amplifier, and a distortion modeling circuit. The predistorter predistorts an input signal to compensate for distortion introduced by the power amplifier. The distortion modeling circuit uses the distortion model to calculate predistorter weighting coefficients applied to the input signal by the predistorter. The distortion model uses tap output normalization to normalize the variance of data signals generated from different basis functions in a set of basis functions to a predetermined value.

Accordingly, embodiments of the present invention include various methods for compensating an input signal for distortion introduced by an electronic device operating on the input signal to produce an output signal. In one exemplary method, first and second signal samples representing a plurality of sampling time instances are generated from input and output signals. For one or more of said sampling time instances, a corresponding set of data samples is generated from the first signal samples and a set of basis functions in a non-linear distortion model of the electronic device or predistorter. The data samples are normalized so that the normalized data samples from each basis function have a pre-determined variance. Model weighting coefficients are then calculated to fit the normalized data samples to the second signal samples according to the non-linear distortion model. The model fitting parameters are used to determine a set of predistorter weights, which are applied by a predistorter to an input signal to the power amplifier.

Other embodiments of the invention comprise a predistortion circuit for predistorting an input signal to compensate for distortion introduced by an electronic device operating on the input signal to produce an output signal. One exemplary predistortion circuit comprises an input circuit, a distortion modeling circuit, and a predistorter. The an input circuit is configured to generate, for each of a plurality of sampling time instances, first and second signal samples from input and output signals. The distortion modeling circuit models the distortion of the electronic device or predistorter and computes predistortion weights for the predistorter. The distortion modeling circuit is configured to generate, for one or more sampling time instances, a corresponding set of data samples from the first signal samples and a set of basis functions in a non-linear distortion model of the electronic device or predistorter. The distortion modeling circuit normalizes the data samples so that the normalized data samples from each basis function have a pre-determined variance, calculates model weighting coefficients to fit the normalized data samples to the second signal samples according to the non-linear distortion model, and determines the predistorter weights from the model weighting coefficients. The predistorter applies the predistortion weights to the input signal to compensate for the distortion introduced by the electronic device.

DETAILED DESCRIPTION

Figure 1:
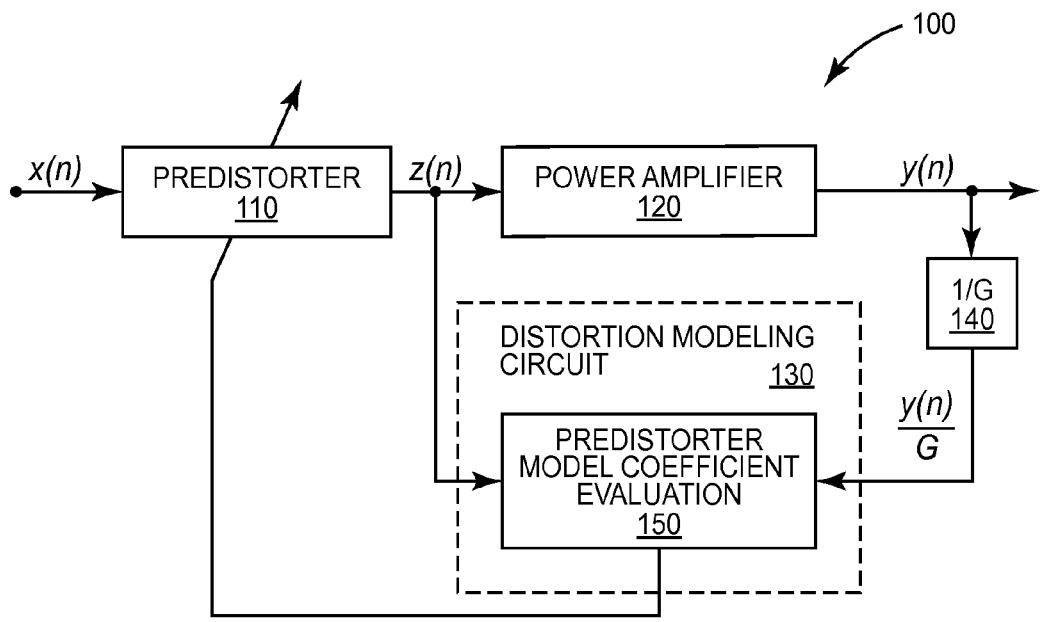
FIG. 1 illustrates an indirect model for a predistortion circuit.

Referring now to the drawings, FIG. 1 illustrates a digital predistortion system 100 configured to compensate for the distortion introduced to a communication signal by a power amplifier 120. A power amplifier 120 is typically most efficient when it is operating in a non-linear range. However, the non-linear response of a power amplifier 120 causes out-of-band emissions and reduces the spectral efficiency in a communication system. A predistorter 110 may be used to improve power amplifier efficiency and linearity by distorting the input signal to the power amplifier 120 to compensate for the non-linear distortion introduced by the power amplifier 120. The cascading of a predistorter 110 and power amplifier 120 improves the linearity of the output signal and thus allows a power amplifier 120 to operate more efficiently. Although predistortion is used in the circuits and systems described herein to linearize the output of a power amplifier 120, those skilled in the art will appreciate that the techniques described are more generally applicable to linearize the output of any type of non-linear electronic device.

As seen in FIG. 1, an input signal x(n) is input to the predistorter 110. The predistorter 110 predistorts the input signal x(n) to compensate for the distortion introduced by the power amplifier 120 when the power amplifier 120 is operated in a non-linear range. The predistorted input signal z(n) produced by the predistorter 110 is then applied to the input of the power amplifier 120. The power amplifier 120 amplifies the predistorted input signal z(n) to produce an output signal y(n). If predistorter 110 is properly designed and configured, then the output signal y(n) contains fewer distortion products and out-of-band emissions than if power amplifier 120 were used alone.

To compensate for the distortion introduced by power amplifier 120, predistorter 110 must have a non-linear transfer function that effectively reverses the non-linear effects of the power amplifier 120. To properly configure the predistorter 110, an appropriate model for this non-linear transfer function is needed. Two different approaches to deriving this non-linear transfer function are possible. The first approach utilizes an indirect-learning architecture, as pictured in FIG. 1, and the second approach uses the direct-learning architecture of FIG. 2.

In both cases, the signal z(n) input to power amplifier 120 and a scaled version of the amplifier output signal y(n) are applied to a distortion modeling circuit 130. The scaling, illustrated as attenuator 140 in FIGS. 1 and 2, reflects the net linear gain G that is desired from the combination of predistorter 110 and power amplifier 120. Scaling the output signal y(n) by the inverse of G permits the non-linearities introduced by power amplifier 120 to be analyzed independently from its gain.

In the indirect-learning architecture of FIG. 1, a general structure for a model of predistorter 110 is taken as given, and its coefficients (parameters) are estimated directly from the input and outputs of power amplifier 120. The distortion modeling circuit 130 includes a coefficient evaluation circuit 150 to evaluate the amplifier input signal z(n) and the amplifier output signal y(n)/G according to a predetermined non-linear distortion model for the predistorter to determine a set of weighting coefficients to be applied by the predistorter 110. This process is described in further detail below. With this indirect approach, a model for the power amplifier 120 is not derived. Rather, the non-linear characteristics of power amplifier 120 are learned indirectly, through the modeling of the predistortion necessary to counteract the distortion introduced by power amplifier 120.

Figure 2:
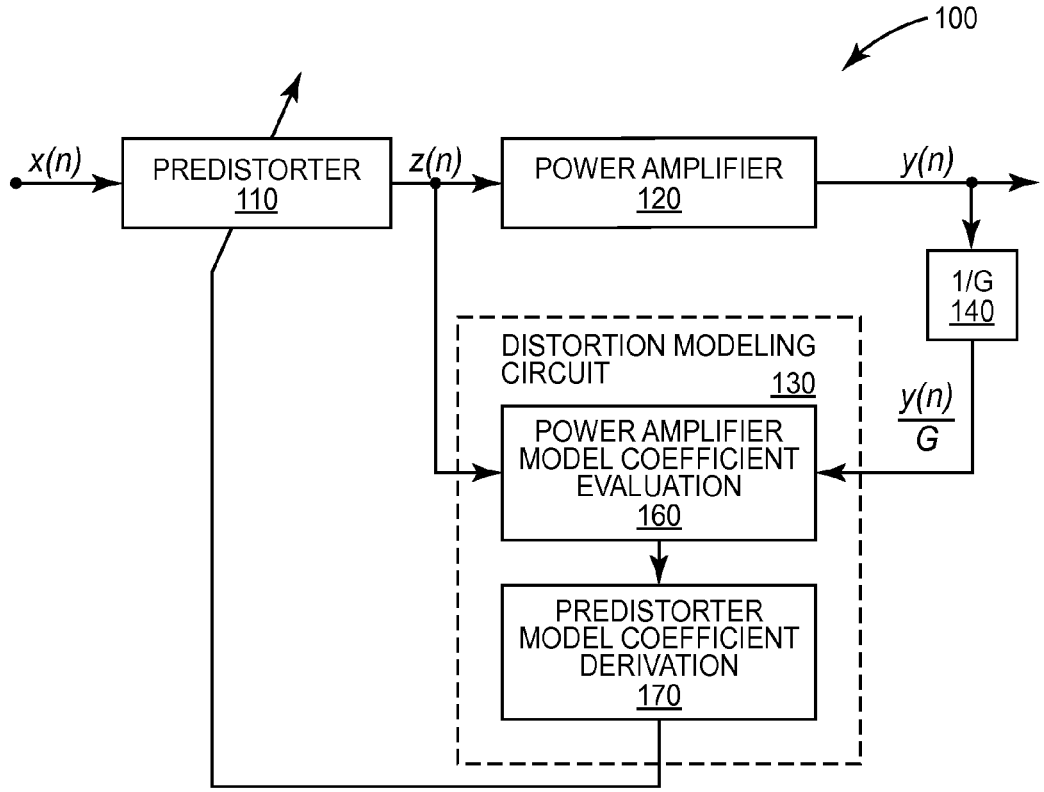
FIG. 2 illustrates a indirect model for a predistortion circuit.

In contrast, the direct-learning architecture of FIG. 2 directly characterizes the non-linear performance of power amplifier 120. The power amplifier includes a coefficient evaluation circuit 160 to evaluate the amplifier input signal z(n) and the amplifier output signal y(n)/G according to a predetermined non-linear distortion model for the power amplifier 120. The weighting coefficients that best fit the power amplifier's non-linear characteristics to the power amplifier model in block 120 are then used by a coefficient derivation circuit 170 to generate weights for configuring the predistorter 110.

The distortion introduced by the predistorter 110 or power amplifier 120 can be represented by a complicated non-linear function, which will be referred to herein as the distortion function. One approach to modeling a distortion function, referred to herein as the decomposition approach, is to decompose the distortion function into a set of less complicated basis functions and compute the output of the distortion function as the weighted sum of the basis function outputs. The set of basis function used to model the distortion function is referred to herein as the basis function set.

Figure 3:
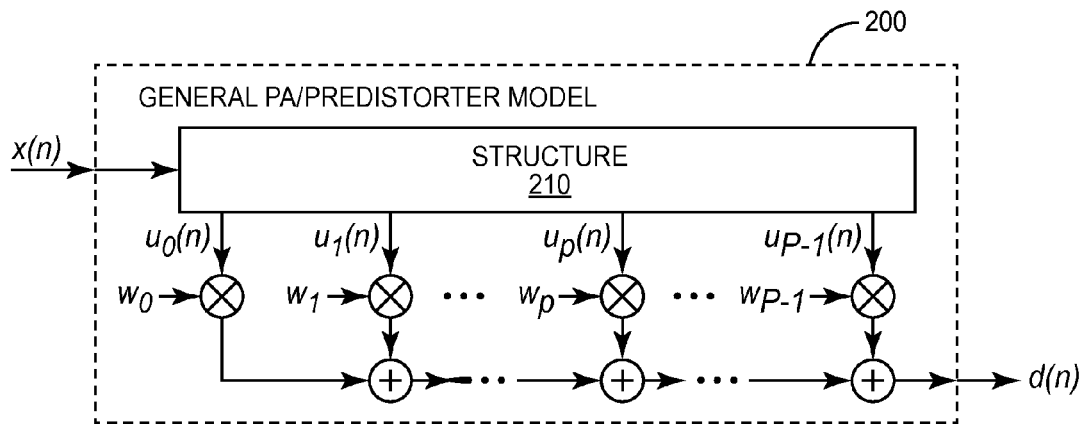
FIG. 3 illustrates a generic distortion model for modeling distortion introduced by a predistorter or power amplifier.

FIG. 3 illustrates a generalized distortion model 200, which may represent the distortion introduced by the power amplifier 120 (e.g., as modeled by model coefficient evaluation unit 160 in the direct learning architecture of FIG. 2) or the predistortion transfer function of predistorter (e.g., as modeled by the predistorter model coefficient evaluation unit 150 of FIG. 1). In either case, the distortion model 200 comprises a structure 210 corresponding to a desired basis function set. The model structure 210 includes P taps, where each tap corresponds to a basis function. It should be noted that, in some embodiments, multiple taps may correspond to the same basis function. The model structure 210 operates on the input signal x(n) to produce data signals $\{u_0(n), u_1(n), \ldots u_{p-1}(n)\}$ at the respective taps. The distortion model 300 then computes a weighted sum of the data signals $\{u_0(n), u_1(n), \ldots u_{p-1}(n)\}$ to obtain a distorted input signal d(n). More specifically, the data signals $\{u_0(n), u_1(n), \ldots u_{p-1}(n)\}$ are multiplied by corresponding weighting coefficients $\{w_0(n), w_1(n), \ldots w_{p-1}(n)\}$, and the resulting products are added together to obtain d(n).

The distortion model shown in FIG. 3 can be represented by:

$$d(n) = \sum_{p=0}^{P-1} w_p u_p(n) \qquad \text{Eq. 1}$$

Equation 1 can be written as a linear equation according to:

$$d(n) = u^T(n) w \qquad \text{Eq. 2}$$

where u is a P×1 vector of data signals output by the model structure at time n and w is a P×1 vector of the weighting coefficients applied to respective data signals.

For a given vector u, d(n) is the desired output of the distortion model 200. In the direct learning architecture, d(n) is the actual output of power amplifier 120. In the indirect-learning architecture, d(n) is the desired output of predistorter 110. The weighting coefficients w that best fit the vector u to the desired output d(n) over a period of time can be learned by fitting multiple observations of u to the corresponding desired outputs d(n). For a set of observations over N sampling instances, the corresponding linear equations given in Equation 2 can be expressed as:

$$U \cdot w = d \qquad \text{Eq. 3}$$

where U is a N×P matrix of data signals and d is an N×1 vector corresponding to the desired output signal of the distortion model for each of the N sampling instances. The columns of the matrix U correspond to the data signals output by respective taps and the rows correspond to different sampling instances. Equation 3 can be evaluated according to well known techniques (e.g., to minimize a criterion such as a least-square-error criterion) to find the weights w that best model the distortion of the amplifier 120 or the predistorter 110.

Figure 4:
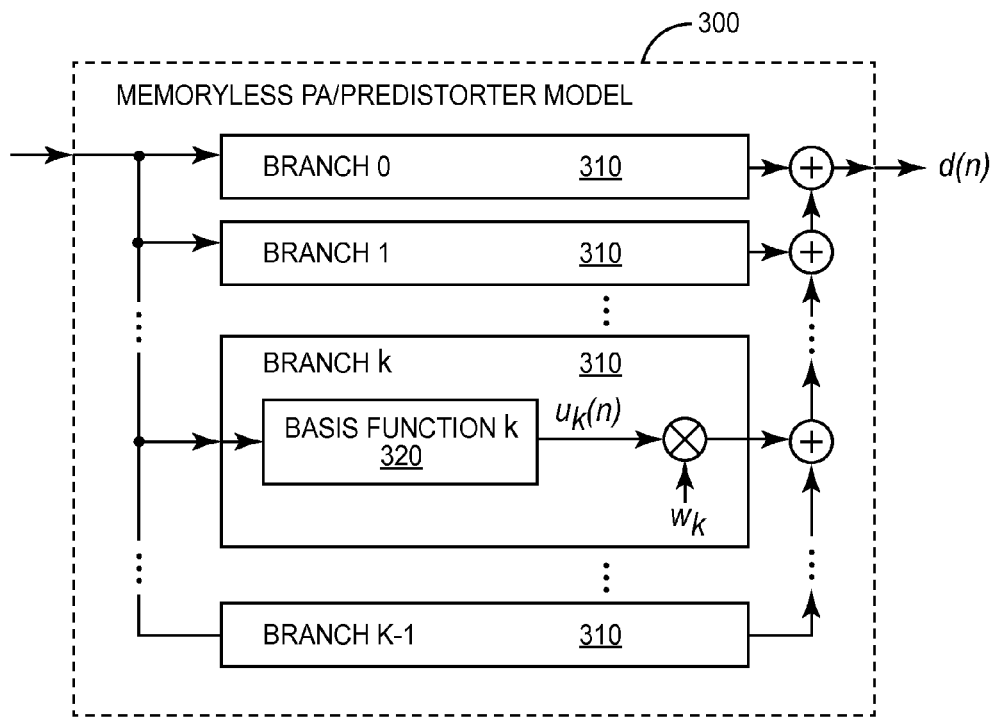
FIG. 4 illustrates a distortion model without memory for modeling distortion introduced by a predistorter or power amplifier.

FIG. 4 illustrates a memoryless, multi-branch distortion model 300 for modeling a distortion function. The distortion model 300 comprises K branches 310, each corresponding to one of K basis functions 320 in a basis function set. The basis functions 320 for each branch operates on the input signal x(n) to produce a basis function output signal $u_k(n)=f_k(x(n))$. In this model, the basis functions are "memoryless" and the basis function output signals $f_k(x(n))$ depend only on the current input signal x(n). The basis function output signals $\{f_0(x(n)), f_1((x(n)), \ldots f_{K-1}(x(n))\}$ are multiplied by corresponding weighting coefficients $\{w_0(n), w_1(n), \ldots w_{K-1}(n)\}$ and added together to obtain d(n).

Comparing the memoryless distortion model 300 shown in FIG. 4 with the general distortion model 200 of FIG. 3, it may be noted that the number of branches K in the memoryless distortion model 300 equals the number of taps P in the general distortion model 200. It may also be noted that the basis function output signals $\{f_0(x(n)), f_1((x(n)), \ldots f_{K-1}(x(n))\}$ output for a given sampling time instance n in the memoryless model 300 correspond to the data samples $\{u_0(n), u_1(n), \ldots u_{p-1}(n)\}$ in the general distortion model 200. Thus, the model of FIG. 4 can be viewed as a special case of the model of FIG. 3 where K=P. The data signals $u_p(n)$ for a given sampling time instance are thus given by:

$$u_p(n)=u_k(n)=f_k(x(n)) \quad \text{Eq. 4}$$

A distortion modeling circuit 130 using the distortion model shown in FIG. 4 computes the weighting coefficients $\{w_0(n), \ldots, w_k, \ldots, w_{(K-1)}(n)\}$ for the base function output signals $u_k(n)$ given x(n) and d(n). Accordingly, the weights w that best model the distortion of the amplifier 120 or the predistorter 110 can be found in a similar manner to that described above, e.g., by fitting a matrix of N observations of the outputs of basis function set to a desired output signal vector d. Because distortion model 300 does not account for memory effects, the accuracy of this model relative to the actual distortion function of a given power amplifier 120 may be limited.

The basis function set used by the memoryless distortion model 300 may comprise a set of power functions used in polynomial models. For example, the basis function set may be designed based on the Volterra series, which is widely used to model non-linear systems. In practical applications, a somewhat simplified model that contains fewer terms than the complete Volterra series can be used to reduce the computational complexity without significantly impacting performance. For example, a polynomial model may be obtained by omitting all but the power terms and may be implemented as a multi-branch model where the power function are used as a basis functions and assigned to respective branches.

Figure 5:
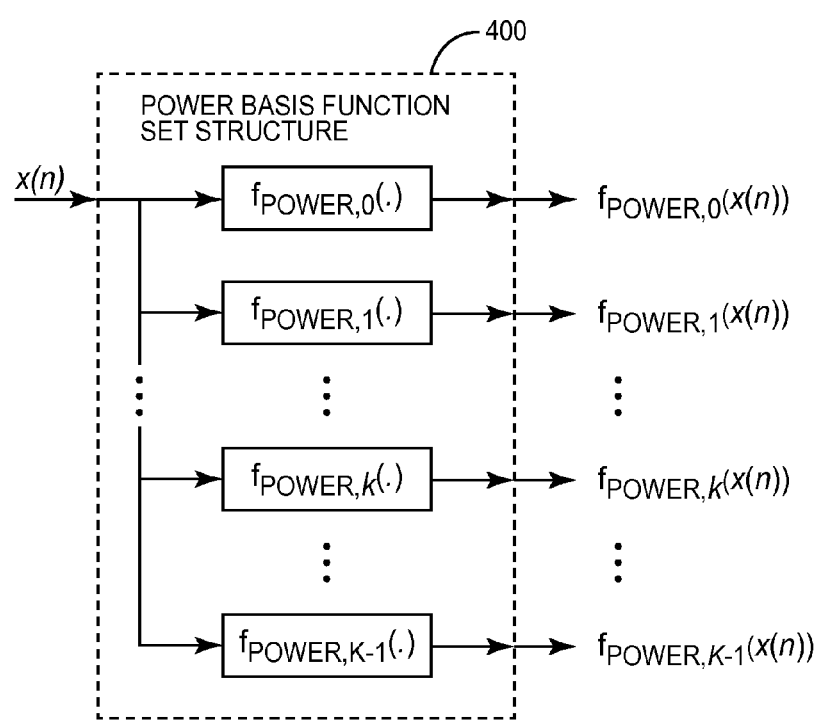
FIG. 5 illustrates an exemplary power basis function set for a distortion model.

FIG. 5 illustrates a basis function structure 400, which may be used to implement a set of power basis functions in the memoryless distortion model 300. The basis function set is constructed from K power basis functions, denoted $f_{POWER,k}(.)$, where the subscript k indicates a power basis function of the k-th order and corresponds to one of the K branches in the distortion model 300. When the power basis functions are used in the distortion model 300, the data signals $u_p(n)$ for a given sampling time instance are given by:

$$u_p(n)=u_k(n)=f_{POWER,k}(x(n))=x(n)|x(n)|^k \quad \text{Eq. 5}$$

An orthogonal basis function set can be constructed as a weighted summation of the power basis functions. An orthogonal basis function set can be advantageous in many applications, as it can provide better numerical stability during the matrix mathematics used to evaluate weighting coefficients for the distortion models. An orthogonal basis function set can be constructed as a weighted summation of the power basis functions. An orthogonal basis function set can be advantageous in many applications, as it can provide better numerical stability during the matrix mathematics used to evaluate weighting coefficients for the distortion models.

Figure 6:
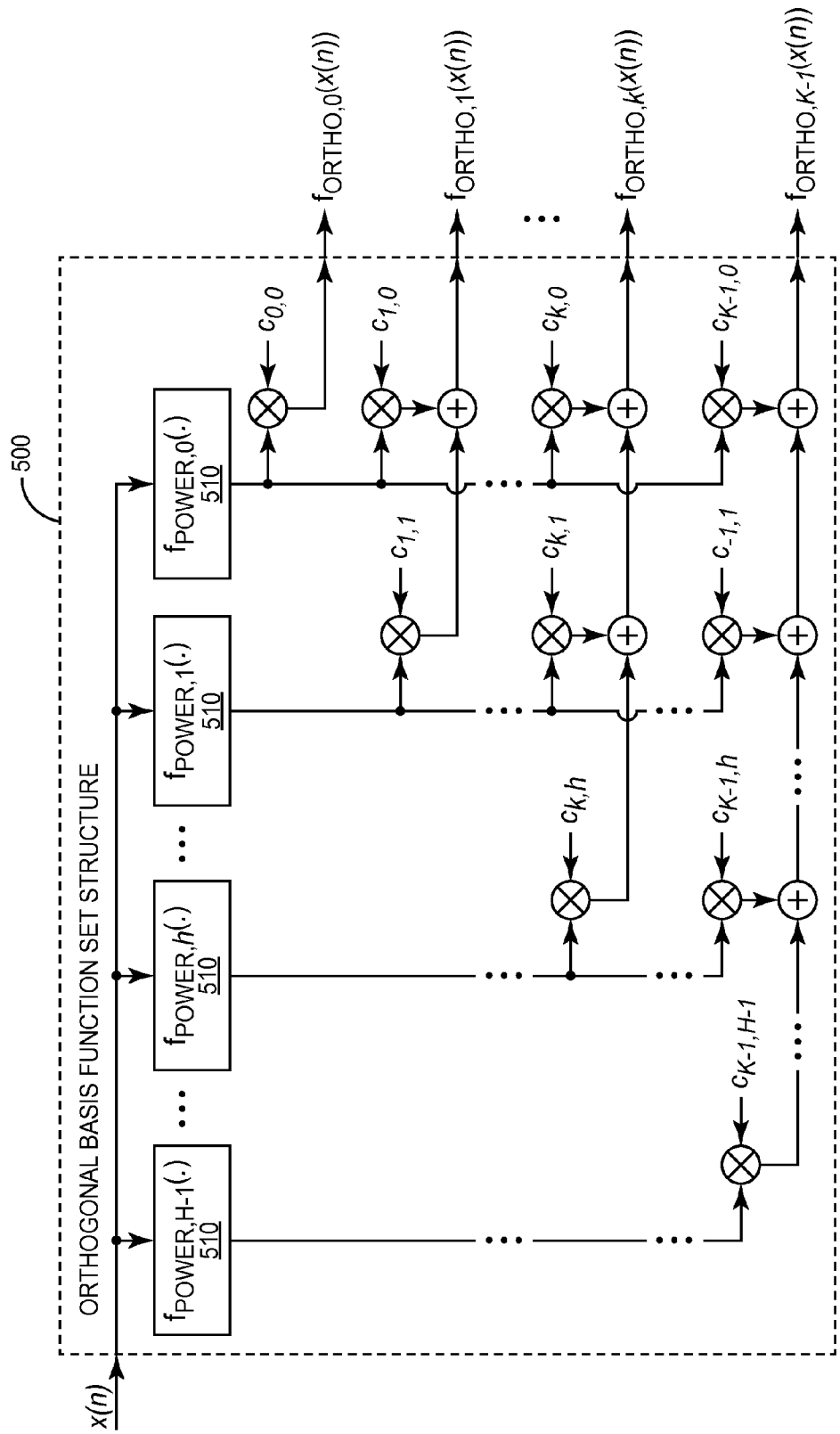
FIG. 6 illustrates an exemplary power basis function set for a distortion model.

FIG. 6 illustrates a basis function structure 500 for implementing an orthogonal basis function set. The basis function structure 500 comprises a set of K power basis functions 510. The input signal x(n) passes through each power basis function 510 to generate a set of power basis function output signals $f_{POWER,h}(x(n))$, where the subscript h denotes the order of the power basis function. The orthogonal basis function output signals, denoted $f_{ORTHO,k}(x(n))$ where subscript k denotes the order, comprise weighted summations of the power basis function output signals $f_{POWER,h}(x(n))$. When the orthogonal basis functions are used in the distortion model 300, the data signals $u_p(n)$ for a given sampling time instance are given by:

$$u_p(n) = u_k(n) = f_{ORTHO,k}(x(n)) = \sum_{h=0}^{k} c_{k,h} f_{POWER,h}(x(n)), \quad \text{Eq. 6}$$

The term $c_{k,h}$, referred to as the connection coefficient, is the weight applied to the h-th order power basis function, $f_{POWER,h}(x(n))$ to generate the k-th order orthogonal basis function $f_{ORTHO,k}(x(n))$. A given ensemble of coefficients $c_{k,h}$ identifies a particular orthogonal basis function set (as given by Equation 6).

An orthogonal basis function set can be designed based on various criteria. One design that works well for several common input signal distributions is derived in Raviv Raich, Hua Qian, and G. Tong Zhou, "Orthogonal polynomials for power amplifier modeling and predistorter design," IEEE Transactions on Vehicular Technology, vol. 53, no. 5, pp. 1468-1479, September 2004.

Figure 7:
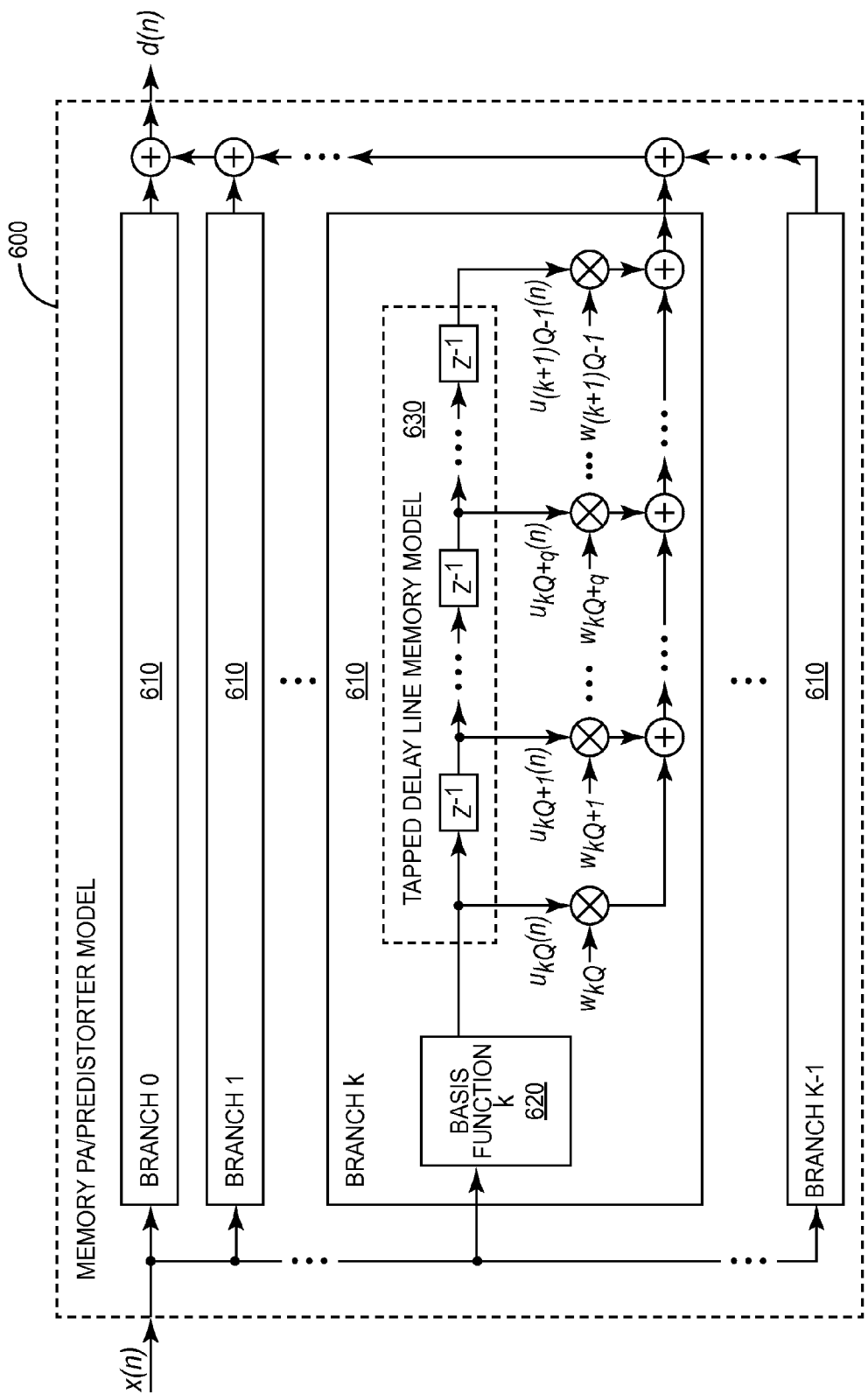
FIG. 7 illustrates a distortion model with memory for modeling distortion introduced by a predistorter or power amplifier.

Memory effects, i.e., the dependence of an output signal on prior states of the input signal as well as on the present state, can also be incorporated into a distortion function. FIG. 7 illustrates a non-linear distortion model 600 with memory. The distortion model 600 comprises K branches 610. Each branch 610 includes a basis function 620 followed by a corresponding memory model 630. The basis function 620, as previously noted, may be one of the power basis functions or orthogonal basis functions. In this model 600, the memory effects corresponding to each basis function 620 are modeled as a tapped delay line with Q taps, where Q is the memory length of the memory model 630. Those skilled in the art will appreciate that other memory models, such as a lattice predictor memory model, could also be used. The output signal of each branch 610 is a weighted sum of basis function output signals produced by a corresponding basis function over Q sampling time instances, including the current sampling time instance and Q−1 previous sampling time instances. For example, if the basis function for branch k is $f_k(\bullet)$ and the input signal is x(n), then the output of branch k is a weighted sum of $f_k(x(n))$, $f_k(x(n-1))$, $f_k(x(n-2))$, etc. The data signals $\{u_{kQ}(n), u_{kQ+1}(n), \ldots u_{kQ+q}(n), \ldots u_{(k+1)Q-1}(n)\}$ output from the memory model taps at the time n are multiplied by corresponding weighting coefficients $\{w_{kQ}(n), w_{kQ+1}(n), \ldots w_{kQ+q}(n), \ldots, w_{(k+1)Q-1}(n)\}$ and the resulting products are summed to produce k branch output signals. The K outputs from the K branches 610 are then summed to form the desired distortion signal d(n).

Comparing the distortion model 600 in FIG. 7 with the general model 200 in FIG. 3, it should be noted that the each branch 610 has Q taps and that there are a total of KQ taps and KQ corresponding weights. The total number of taps, KQ, in this model equals the number of taps, P, in the general model 200. It should further be noted that the KQ data signals $\{u_{kQ}(n), u_{kQ+1}(n), \ldots u_{kQ+q}(n), \ldots u_{(k+1)Q-1}(n)\}$ correspond to the P data samples $\{u_0(n), u_1(n), \ldots u_{p-1}(n)\}$ output by the model structure 210 in the general model 200.

A distortion modeling circuit 130 using the distortion model 600 shown in FIG. 7 computes the weighting coefficients $\{w_{kQ}(n), w_{kQ+1}(n), \ldots w_{kQ+q}(n), \ldots, w_{(k+1)Q-1}(n)\}$ for the memory model taps given x(n) and d(n). Thus, once more, the weights w (in this case a 1×KQ vector) can be estimated by recording N observations of the outputs of the KQ samples, to form a matrix U, and fitting the matrix U to a desired output signal vector d according to Equation 3 and a particular optimization criterion. Given an appropriate basis function set and a memory model of adequate depth, the resulting distortion will generally provide better models of real-world device distortion than a memoryless model.

As suggested in the discussion above, each of the models in FIGS. 3-7 includes a set of data samples u, that can be expressed by:

$$\underset{1 \times P}{u^T(n)} \cdot \underset{P \times 1}{w} = d(n) \qquad \text{Eq. 7}$$

This is true whether or not the model includes memory. In a memoryless model, the elements of $u^T$ consist only of the basis function output signals, i.e., each element is strictly a function of x(n). In a model with memory, $u^T$ also includes elements corresponding to delayed versions of the basis function output signals. Thus, some elements of $u^T$ may correspond to a function of x(n−1), x(n−2), etc. Note that in Equation 7 and as generally used herein, $(\bullet)^T$ denotes a transpose, $(\bullet)^H$ denotes a conjugate transpose, P is the number of coefficients in the model, the P×1 vector u(n) denotes all of the data samples in the model at a given time index n, the P×1 vector w denotes all the coefficients in the distortion model, and d(n) is the desired output of the model for time instance n.

For any given time index n, both u(n) and d(n) are known, and Equation 7 is a linear equation of w. As noted earlier, for observations obtained on N time indices, the corresponding linear equations expressed in Equation 7 can be compactly expressed as:

$$\underset{N \times P}{U} \cdot \underset{P \times 1}{w} = \underset{N \times 1}{d} \qquad \text{Eq. 8}$$

In Equation 8, U is the input data matrix and d is the desired output vector.

In the indirect-learning architecture of FIG. 1, d(n) is the desired output of predistorter 110, which ideally has a distortion function that perfectly compensates for the distortion introduced by power amplifier 120. Thus, d(n) corresponds to z(n), the input to power amplifier 120, when the indirect-learning architecture is used. The input signal to the distortion model, denoted x(n) in FIGS. 3-7, corresponds to the scaled output of the power amplifier 120, y(n)/G. Thus, for any given model structure, samples of the output from power amplifier 120 are taken for each of N sampling instances and applied to a set of basis functions to produce a matrix U. This matrix U is fitted to the desired output vector d according to Equation 8, where d is a vector of samples of the input to power amplifier, taken at the same N sampling instances used to form the matrix U.

As discussed earlier, the distortion characteristics for the power amplifier 120 are modeled directly in the direct-learning architecture, pictured in FIG. 2. In this case, the "desired" distortion signal d(n) corresponds to the scaled output of power amplifier 120, y(n)/G. The input x(n) to the model corresponds to the input signal of the power amplifier. Thus, for any given model structure, samples of the input from power amplifier 120 are taken for each of N sampling instances and applied to a set of basis functions to produce a matrix U. This matrix U is fitted to the desired output vector d according to Equation 6, where d is a vector of samples of the scaled output from the power amplifier, taken at the same N sampling instances used to form the matrix U.

Regardless of the details of the model structure, and regardless of whether the indirect-learning architecture or the direct-learning architecture is used, at the center of the coefficient evaluation in digital predistorter 110 of FIGS. 1 and 2 is the problem of estimating the coefficient vector w based on Equation 8 satisfying a certain criterion. In order to solve this estimation problem, inversion of the data matrix U, or $U^H U$, in some form is required. A well known measure of sensitivity of a matrix to digital operations, such as matrix inversion, is the so-called condition number, which is defined as the ratio of the maximum Eigen value of a matrix to its minimum Eigen value. Matrices with condition numbers near 1 are said to be well-conditioned.

Because matrix computations can be quite complex, an important goal in the design of a distortion model for a power amplifier 120 or a predistorter 110 is to provide to the coefficient evaluation algorithm a data matrix $U^H U$ that has a relatively small number of columns (to reduce the computational complexity of the matrix operations), that has a condition number as close to 1 as possible (high numerical stability), and that at the same time also models the physical behavior of the power amplifier or predistorter as exactly as possible, given a particular optimization criteria. Differences between the distribution of input signals used to derive the basis function set for the distortion model and the distribution of actual data applied to the predistorter 110 may result in a data matrix $U^H U$ with a large condition number.

According to embodiments of the present invention, a normalization function is added to the distortion model to normalize the variance across columns of the matrix U. The variance across the columns of the matrix U is a contributing factor to the condition number of the matrix $U^H U$. A non-uniform variance across the columns of the matrix U typically results in an increase of the condition number of the matrix $U^H U$. On the other hand, a uniform variance across the columns of U will produce a well-conditioned matrix $U^H U$. The basic concept is to normalize the variance of the output signal for each tap in the distortion model to a predetermined value.

Figure 8:
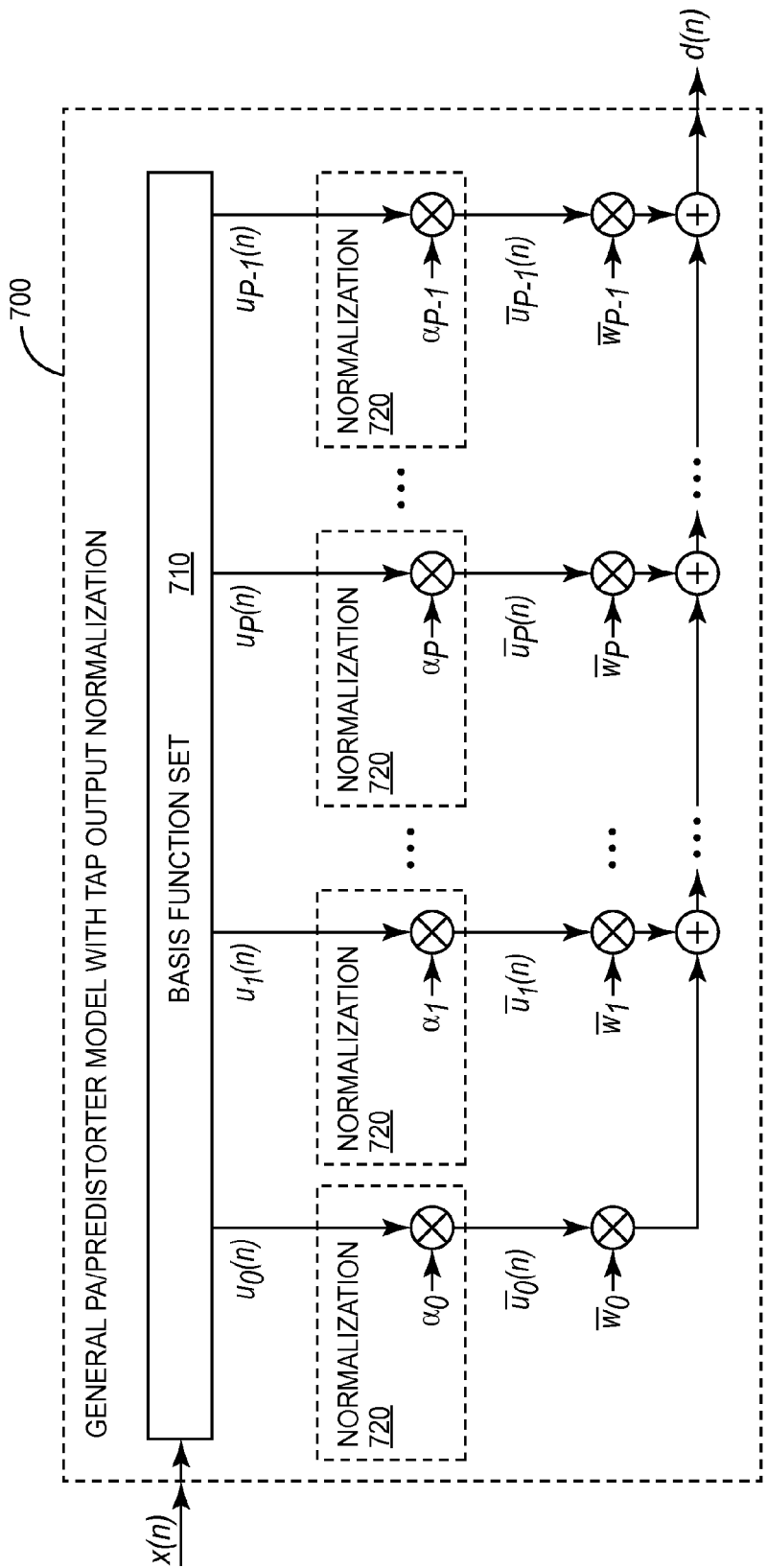
FIG. 8 illustrates a generic distortion model with tap output normalization.

FIG. 8 illustrates a generic distortion model 700 with tap output normalization, which may be compared to the distortion model 200 of FIG. 3. The distortion model 700 comprises a model structure 710 with P taps. A normalization block 720 operates on each tap output to normalize the variance of the data signals output on each tap to produce normalized data signals $\{\bar{u}_0(n), \bar{u}_1(n), \ldots, \bar{u}_p(n), \ldots, \bar{u}_{P-1}(n)\}$. More specifically, the normalization blocks 720 multiply the tap output signals $u_p(n)$ by a corresponding normalization factor $\alpha_p$. The normalization factor $\alpha_p$ may be different for different taps and is chosen based on the variance of the tap output signal $u_p(n)$ over a predetermined time interval. The normalization factor $\alpha_p$ for each tap may be pre-configured, or may be updated at a desired update frequency. The normalized tap output signal for the p th tap is given by:

$$\bar{u}_p(n) = \alpha_p u_p(n). \qquad \text{Eq. 9}$$

The normalized tap output signals $\bar{u}_p(n)$ produced on each tap are multiplied by corresponding weighting coefficients $\bar{w}_p$ and the resulting products are summed to obtain d(n).

The distortion model 700 with normalized tap outputs may be represented by:

$$d(n) = \sum_{p=0}^{P-1} \bar{w}_p \bar{u}_p(n) = \sum_{p=0}^{P-1} \bar{w}_p \alpha_p u_p(n) = \sum_{p=0}^{P-1} \hat{w}_p u_p(n) = u^T(n)\hat{w}. \qquad \text{Eq. 10}$$

where the term $\hat{w} = \alpha_p \bar{w}_p$ and $\hat{w} = [\hat{w}_0, \hat{w}_1, \ldots, \hat{w}_{P-1}]^T$. It should be noted that the normalization and weighting operations are linear. Thus, the product of the weighting coefficient $\bar{w}_p$ multiplied by the normalization factor $\alpha_p$ in Eq. 10 equals the weighting coefficient $w_p$ in Equations 1-3. Therefore, the model given in Equation 10 is, in theory, equivalent to the model without tap output normalization given in Equations 1-3.

In one exemplary embodiment, the normalization factor $\alpha_p$ for a given tap is chosen to be proportional to the reciprocal at the square root of the variance of the data samples from the tap. The normalization factor $\alpha_p$ can be computed according to:

$$\alpha_p = (var(u_p(n)))^{-1/2}\beta = (E[(u_p(n)-m_p)(u_p(n)-m_p)^*])^{-1/2}\beta \qquad \text{Eq. 11}$$

where var denoted variance, E denotes expected value, $\beta$ (e.g. $\beta$=1) denotes a predetermined value for normalization operations, and $m_p$ is the mean of the data sequence $u_p(n)$ over a predetermined time interval. The symbol * denotes the conjugate. The choice of the value of $\beta$ may be determined by the implementation and may be any arbitrary value. For many practical applications, setting $\beta$=1 will provide good performance. The value of $m_p$ will be zero if the input sample sequence has zero mean and the power basis function or orthogonal basis function set is used.

Figure 9:
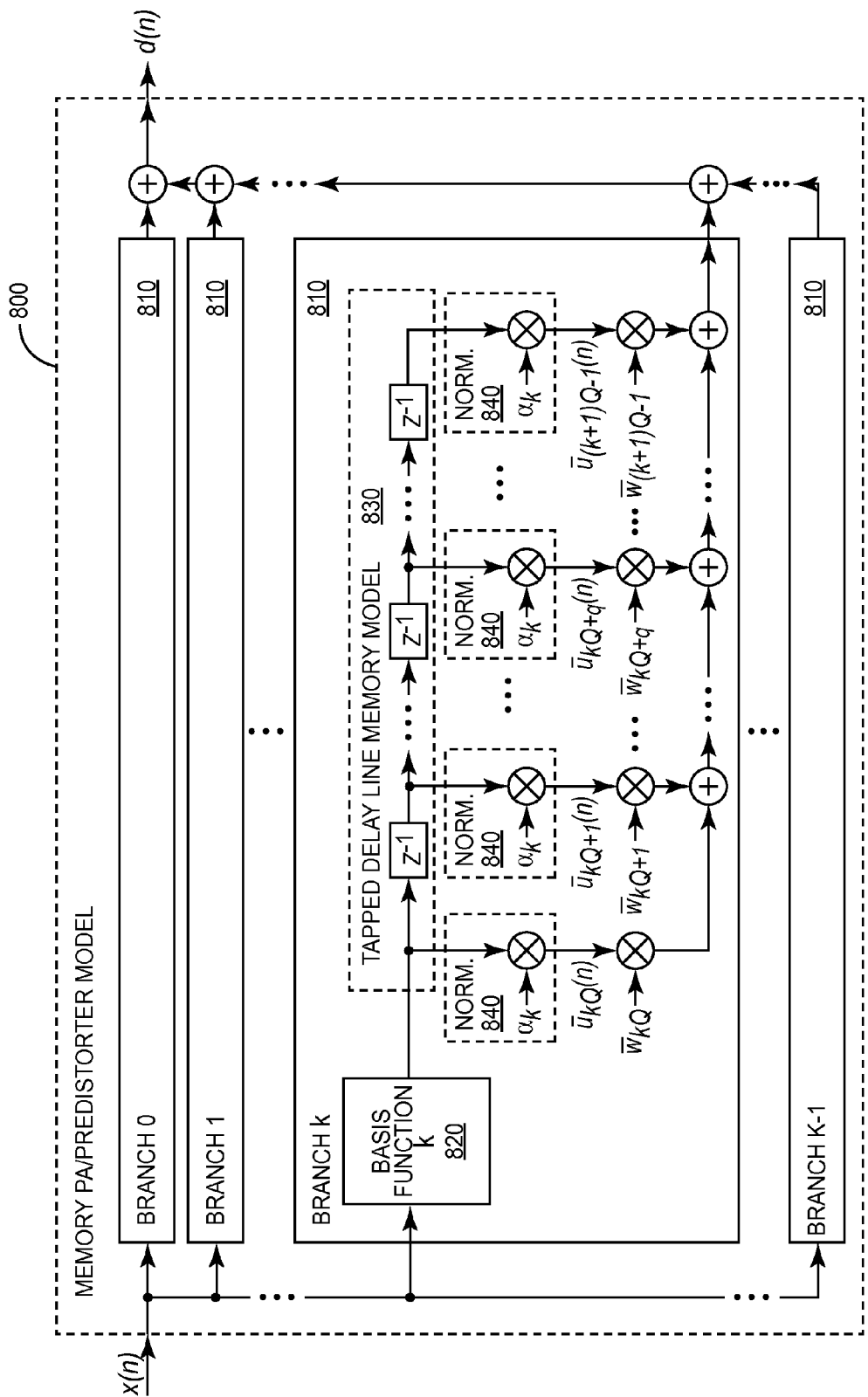
FIG. 9 illustrates an alternative distortion model with memory and tap output normalization.

A distortion modeling circuit 130 using the distortion model 600 shown in FIG. 7 computes the weighting coefficients $\bar{w} = \{\bar{w}_0, \bar{w}_1, \ldots \bar{w}_{P-1}\}$ given x(n) and d(n). The weights $\hat{w}$ (in this case a 1×P vector) can be estimated by recording N observations of the outputs of the P samples, to form a matrix U, and fitting the matrix U to a desired output signal vector d according to Equation 10 and a particular optimization criterion. In implementation where the predistorter applies tap output normalization, the weighting coefficients $\hat{w}$ may be used as the predistorter coefficients. In embodiments where the predistorter does not apply normalization, the predistorter weighting coefficients may be computed as the product of respective products of weighting coefficients multiplied by respective normalization factors, FIG. 9 illustrates one approach to tap output normalization in a distortion model 800 with memory, which may be compared with the distortion model in FIG. 5. The distortion model 800 comprises a plurality of branches 810. Each branch 810 includes a basis function 820 and memory model 830. The basis function 810, as previously noted, may be one of the power basis functions or orthogonal basis functions in the basis functions set. There is a one-to-one correspondence between the branches 810 in the distortion model 800 and the basis functions 820 in the basis function set. The memory model 830 is represented as a tapped delay line with Q taps, where Q is the memory length. Compared to the generic model, the total number of taps P in the memory model is K·Q. Normalization blocks 840 multiply the data signals output on each tap by a normalization factor $\alpha_k$. The data signals from the taps are multiplied by respective coefficients, e.g., $\bar{w}_{kQ}, \bar{w}_{kQ+1}, \ldots \bar{w}_{(k+1)Q-1}$, and the resulting products are summed to produce branch output signals. The branch output signals in turn are summed to obtain d(n). In this model, the distortion modeling circuit 130 computes the normalization factors $\alpha_k$ and the weighting coefficients $\bar{w}_{kQ}$ for the memory model taps given x(n) and d(n).

Figure 10:
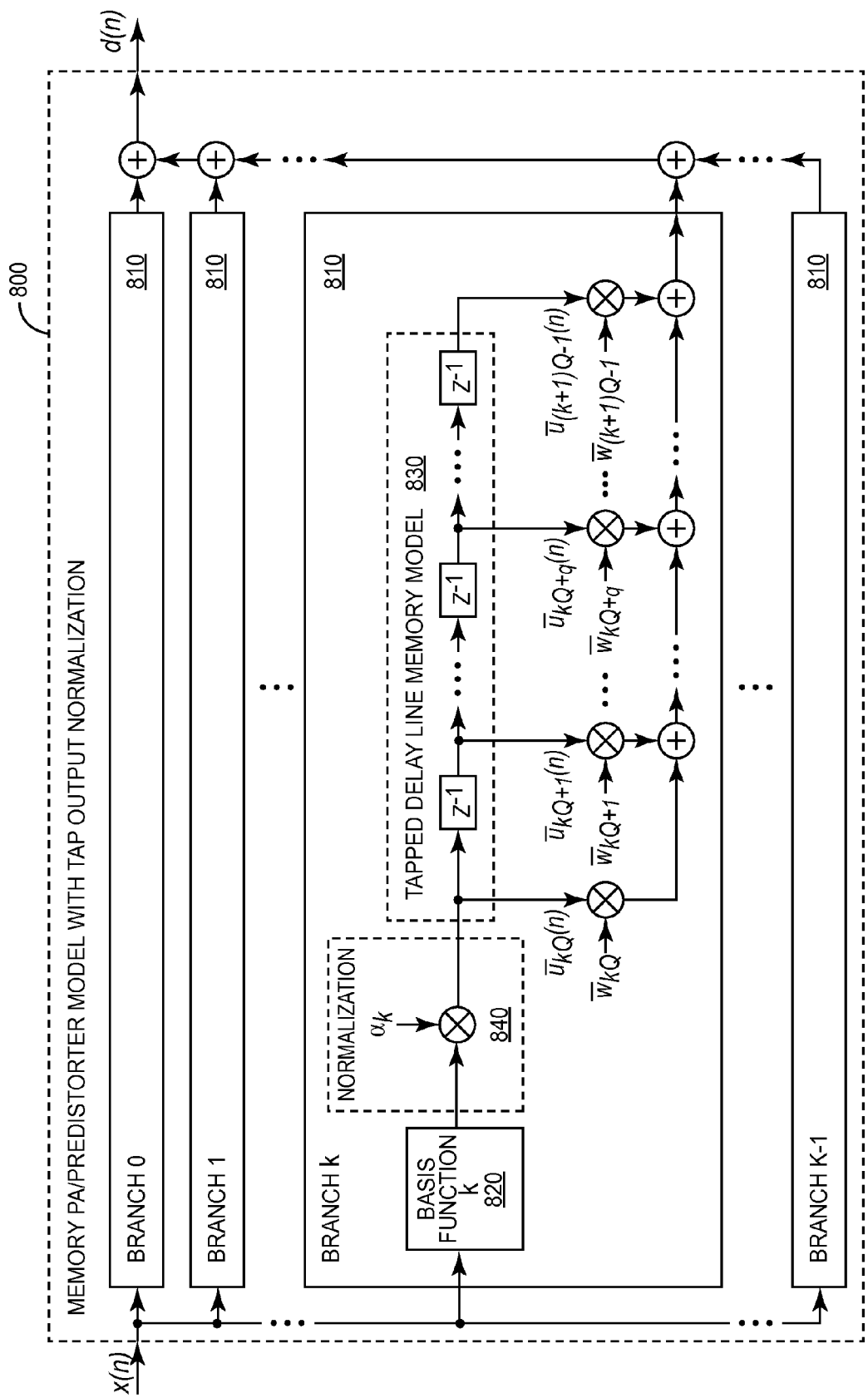
FIG. 10 illustrates an alternative distortion model with memory and tap output normalization.
Figure 11:
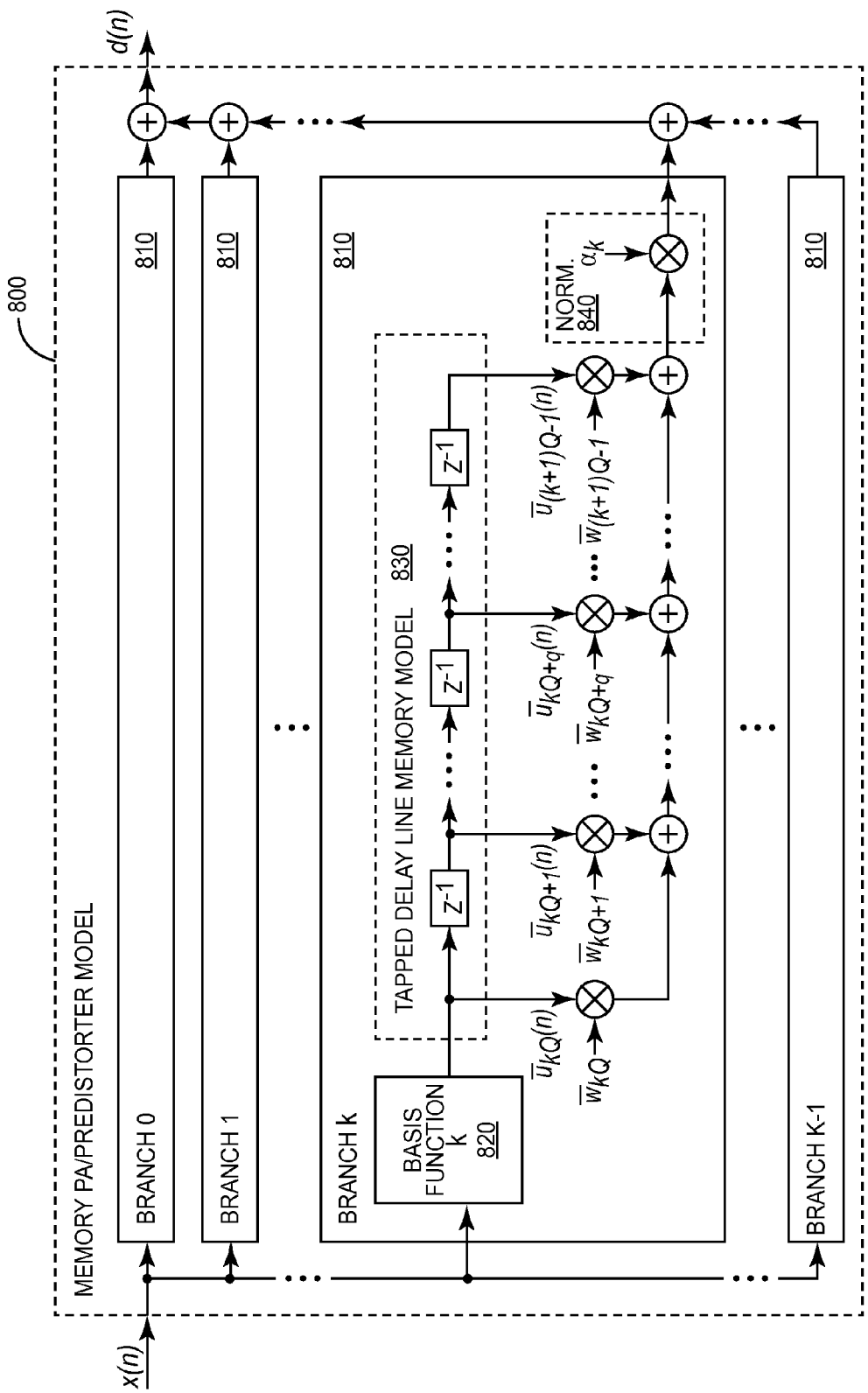
FIG. 11 illustrates an alternative distortion model with memory and tap output normalization.

FIG. 10 illustrates an alternate approach to tap output normalization in a distortion model 800 with memory, which may be compared with the distortion model in FIG. 9. For convenience, the reference numbers used in FIG. 9 are reused in FIG. 10 to indicate similar components in the distortion model 800. In this embodiment, the normalization block 840 is moved from the memory model taps to the input of the memory model 830. This approach can be used when the input sequence to the memory model 830 is wide sense stationary. In this case, the data samples at each tap will have the same variance. Therefore, a single multiplication may be performed on the basis function output signal. Alternatively, the normalization block 840 could be used to normalize the branch output signals as shown in FIG. 11. The modeling approaches shown in FIGS. 10 and 11 reduce the number of computations needed to calculate the weighting coefficients.

Figure 12:
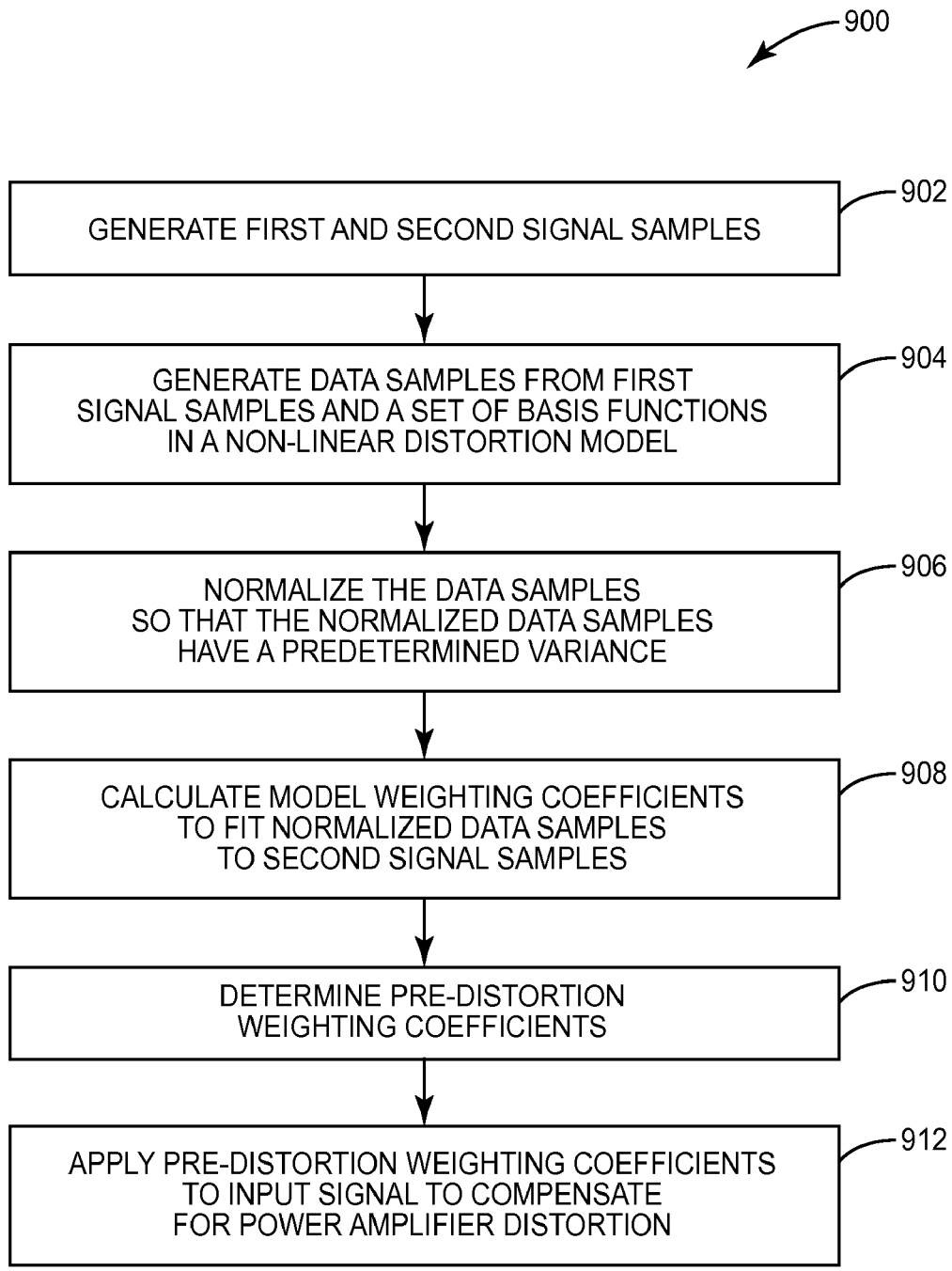
FIG. 12 illustrates an exemplary method of predistorting a power amplifier input signal.

FIG. 12 illustrates an exemplary method 900 according to one embodiment of the invention for predistorting an input signal to compensate for non-linear distortion in an electronic device, such as a power amplifier. First and second signal samples are generated for input to a distortion modeling circuit 130 (block 902). In the indirect approach, the first signal samples are generated by sampling the power amplifier output signal and the second signal samples are generated by the predistorter. Alternatively, the second signal samples could be generated by sampling the signal at the input to the power amplifier. In the direct approach, the first signal samples are provided by the predistorter, or by sampling the power amplifier input, and the second signal samples are generated by sampling the output of the power amplifier.

The distortion modeling circuit 130 generates data samples from the first input signal samples and a set of basis functions used in the distortion model (block 904). In embodiments lacking memory, one data sample is generated for each basis function in the basis function set for each sampling time instance. In embodiments with memory, multiple data samples are generated for each basis function in the basis function set for each sampling time instance.

In both the direct and indirect approaches, the distortion modeling circuit 130 normalizes the data samples so that the normalized data samples have a predetermined variance (e.g., var=1) (block 906). The distortion modeling circuit 130 then calculates model weighting coefficients to fit the normalized data samples to the second signal samples (block 908). In the indirect approach the second signal samples are the samples output from the predistorter, or alternatively, samples generated by sampling the signal at the input to the power amplifier. In the direct approach, the second signal samples are generated by sampling the power amplifier output signal.

The model weighting coefficients are used to compute predistorter weighting coefficients (block 910). In the indirect approach, the distortion modeling circuit 130 models the predistorter and the predistorter weighting coefficients are the products of the model weighting coefficients multiplied by respective normalization factors. Alternatively, if the predistorter includes a normalization block for normalizing the data samples from the basis functions, the model weighting coefficients can be used as the predistorter weighting coefficients. In the direct approach, the distortion modeling circuit 130 models the power amplifier and computes power amplifier coefficients. The predistorter weighting coefficients can then be derived by matrix inversion of the power amplifier coefficient matrix.

Once the weighting coefficients are calculated, a predistorter is configured with the weighting coefficients so that the predistorter applies the weighting coefficients to predistort the input signal. The predistorter, as previously noted, may be implemented by hardware circuits or by a processor using the same distortion model as the distortion modeling circuit 130. The predistorter 110 applies the predistortion weighting coefficients to the input signal x(n) to generate the predistorted signal z(n). For each input signal sample, the predistorter 110 computes a set of basis functions output signals and sums the basis function output signals weighted by respective predistorter weighting coefficients. The predistorter weighting coefficients may be statically configured, or may be periodically updated at a desired update frequency.

Figure 13:
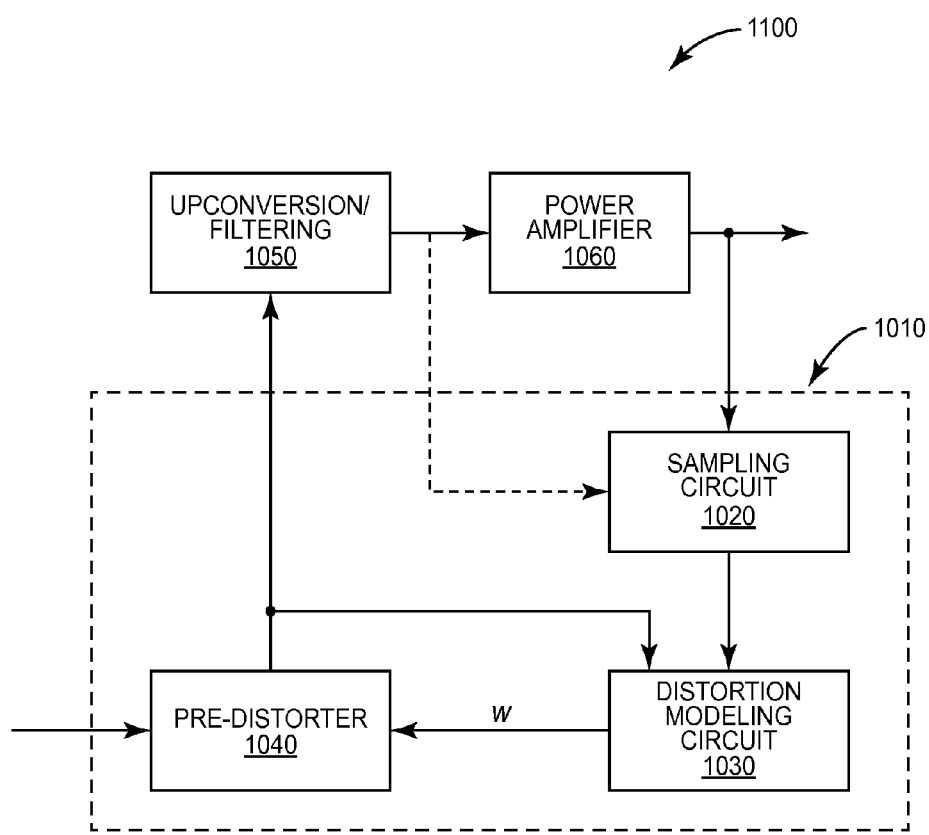
FIG. 13 illustrates an exemplary predistorting circuit for predistorting a power amplifier input signal.

FIG. 13 illustrates an exemplary predistortion circuit 1010 for a power amplifier, which may be implemented by a digital processing circuit, such as a baseband processor, hardware, firmware, or a combination thereof. The predistortion circuit comprises a predistorter 1040, sampling circuit 1020, and distortion modeling circuit 1030. A modulated input signal is applied to the predistorter 1040. The predistorter 1040 predistorts the input signal to generate a predistorted signal. An upconverter/filter circuit 1050 upconverts and filters the predistorted signal for input to the power amplifier 1060. During the upconversion, the predistorted signal is converted from the digital to analog domain. Power amplifier 1060 amplifies the predistorted signal to generate an output signal for transmission.

The power amplifier output signal is sampled by a sampling circuit 1020 to generate a set of signal samples for input to the distortion modeling circuit 1030. In embodiments using an indirect modeling approach, the output signal from the power amplifier 1060 is sampled to generate the input signal x(n) for the distortion model. The output signal d(n) for the distortion model comprises the predistorter output. In embodiments using a direct modeling approach, the input signal x(n) to the power amplifier is sampled to generate the input signal for the distortion model, and the output signal from the power amplifier is sampled to generate the output signal d(n) for the distortion model.

The distortion modeling circuit 1030, as previously described, models the distortion introduced by either the predistorter 1040 (indirect approach) or power amplifier 1060 (direct approach). The distortion modeling circuit 1030 computes a set of model weighting coefficients w to fit the input signal to the distortion model to the output signal. The distortion modeling circuit 1030 also computes the predistorter coefficients from the model weighting coefficients. In the indirect approach, the model weighting coefficients may be multiplied by corresponding normalization factors to obtain the predistorter weighting coefficients. In the direct approach, the matrix of the model weighting coefficients needs to be inverted before computing the predistorter weighting coefficients.

The normalization of the data samples used in the calculation of the weighting coefficients results in a significant reduction in the condition number of the matrix $U^H U$. The lower condition number means that the predistorter model is less sensitive and more stable. The normalization block can be flexibly applied only when non-uniform variance is present without degradation in the accuracy of the distortion model. The distortion models with and without tap output normalization are mathematically equivalent. The normalization can be achieved at low cost with the addition of a single real multiplier to each branch of the distortion model because the normalization factor is always real. The normalization of the tap output signals has the potential to reduce the dynamic range of the distortion model and thus increase hardware efficiency.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of compensating an input signal for distortion introduced by an electronic device operating on the input signal to produce an output signal, the method comprising:
   generating, for each of a plurality of sampling time instances, first and second signal samples representing said input and output signals;
   generating, for one or more of said sampling time instances, a corresponding set of data samples from said first signal samples and a set of basis functions in a non-linear distortion model of the electronic device or predistorter;
   normalizing the data samples so that the normalized data samples from each basis function have a pre-determined variance;
   calculating model weighting coefficients to fit the normalized data samples to the second signal samples according to the non-linear distortion model;
   determining predistortion weights from the model weighting coefficients; and
   applying the predistortion weights to the input signal to compensate for the distortion introduced by the electronic device.

2. The method of claim 1, wherein generating the corresponding set of data samples for a given sampling time instance comprises computing one or more data samples based on first signal samples corresponding to two or more sampling time instances.

3. The method of claim 2 wherein computing one or more data samples based on first signal samples corresponding to two or more sampling time instances comprises:
   computing basis function output signals corresponding to two or more sampling time instances; and
   generating said one or more data samples from the basis function output signals.

4. The method of claim 3, wherein normalizing the data samples comprises normalizing said basis function output signals and generating normalized data samples from said normalized basis function output signals.

5. The method of claim 3 wherein normalizing the data samples comprises generating the one or more data samples from said basis function output signals as non-normalized data samples and normalizing said non-normalized data samples.

6. The method of claim 1, wherein normalizing the data samples comprises multiplying the data samples generated from each basis function by a corresponding normalization factor proportional to the reciprocal of the square root of the variance of the data samples generated by the basis function.

7. The method of claim 1 wherein the non-linear distortion model comprises a predistorter model and wherein determining predistortion weights from the model weighting coefficients comprises computing predistortion weights from the model weighting coefficients of the predistortion model.

8. The method of claim 7 wherein computing predistortion weights from the model weighting coefficients comprises computing predistortion weights as the products of the model weighting coefficients and respective normalization factors.

9. The method of claim 1 wherein the non-linear distortion model comprises a distortion model of the electronic device and wherein determining predistortion weights from the model weighting coefficients comprises:
computing power amplifier weighting coefficients from the model weighting coefficients, and
computing predistorter weighting coefficients as the inverse of the power amplifier weighting coefficients.

10. The method of claim 1, wherein the data samples for a given sampling time instance comprises computing data samples as branch output signals from said first signal samples and a set of basis functions corresponding to said respective branches.

11. The method of claim 10 wherein normalizing the data samples comprises normalizing the branch output signals.

12. The method of claim 10 wherein said branch output signals are computed as a weighted sum of basis function output signals corresponding to two or more sampling time instances.

13. A predistortion circuit for predistorting an input signal to compensate for distortion introduced by an electronic device operating on the input signal to produce an output signal, the predistortion circuit comprising:
an input circuit configured to generate, for each of a plurality of sampling time instances, first and second signal samples representing said input and output signals;
a distortion modeling circuit to model distortion of the electronic device or predistorter and to compute predistortion weights, said distortion modeling circuit configured to:
generate, for one or more of said sampling time instances, a corresponding set of data samples from said first signal samples and a set of basis functions in a non-linear distortion model of the electronic device or predistorter;
normalize the data samples so that the normalized data samples from each basis function have a pre-determined variance;
calculate model weighting coefficients to fit the normalized data samples to the second signal samples according to the non-linear distortion model;
determine predistortion weights from the model weighting coefficients;
a predistorter to apply the predistortion weights to the input signal to compensate for the distortion introduced by the electronic device 14. The predistortion circuit of claim 13 wherein the distortion modeling circuit is configured to generate the corresponding set of data samples for a given sampling time instance by computing one or more data samples based on first signal samples corresponding to two or more sampling time instances.

15. The predistortion circuit of claim 14 wherein the distortion modeling circuit is configured to compute the one or more data samples by computing basis function output signals corresponding to two or more sampling time instances, and generating said one or more data samples from the basis function output signals.

16. The predistortion circuit of claim 15 wherein the distortion modeling circuit is configured to normalize the data samples by normalizing said basis function output signals and generating normalized data samples from said normalized basis function output signals.

17. The predistortion circuit of claim 15 wherein the distortion modeling circuit is configured to normalize the data samples by generating the one or more data samples from said basis function output signals as non-normalized data samples and normalizing said non-normalized data samples.

18. The predistortion circuit of claim 15 wherein the distortion modeling circuit is configured to normalize the data samples by multiplying the data samples generated from each basis function by a corresponding normalization factor proportional to the reciprocal of the square root of the variance of the data samples generated by the basis function.

19. The predistortion circuit of claim 13 wherein the non-linear model comprises a predistorter model and wherein the distortion modeling circuit is configured to compute predistortion weights from the model weighting coefficients of the predistortion model.

20. The predistortion circuit of claim 19 wherein the distortion modeling circuit is configured to compute the predistortion weights as the products of the model weighting coefficients and respective normalization factors.

21. The predistortion circuit of claim 13 wherein the non-linear model comprises a distortion model of the electronic device and wherein the distortion modeling circuit is configured to:
compute power amplifier weighting coefficients from the model weighting coefficients of the electronic device distortion model; and
compute predistortion weighting coefficients as the inverse of the power amplifier weighting coefficients.

22. The predistortion circuit of claim 13 wherein the distortion modeling circuit is configured to compute data samples as branch output signals from said first signal samples and a set of basis functions corresponding to said respective branches.

23. The predistortion circuit of claim 22 wherein the distortion modeling circuit is configured to normalize the data samples by normalizing the branch output signals.

24. The predistortion circuit of claim 22 wherein the distortion modeling circuit is configured to compute the branch output signals as the weighted sum of basis function output signals corresponding to two or more sampling time instances.

* * * * *

UNITED STATES PATENT AND TRADEMARK OFFICE
CERTIFICATE OF CORRECTION

PATENT NO.            : 8,390,376 B2                                         Page 1 of 1
APPLICATION NO.       : 13/119160
DATED                 : March 5, 2013
INVENTOR(S)           : Bai It is certified that error appears in the above-identified patent and that said Letters Patent is hereby corrected as shown below:

On the Title Page, in Item (56), under "OTHER PUBLICATIONS", in Column 2, Line 4, delete "la." and insert -- al., --, therefor.

In the Specification:

In Column 2, Line 8, delete "The an" and insert -- The --, therefor.

In Column 9, Line 16, in Equation 10, after Equation, delete "." and insert -- , --, therefor.

In Column 9, Line 19, delete " $\hat{W}$ " and insert -- $\hat{w}_p$ --, therefor.

In Column 9, Line 48, delete " $\hat{W}$ " and insert -- $\overline{W}$ --, therefor.

In Column 9, Line 53, delete " $\hat{W}$ " and insert -- $\overline{W}$ --, therefor.

In Column 9, Line 58, delete "factors," and insert -- factors. --, therefor.

In Column 9, Line 64, delete "810," and insert -- 820, --, therefor.

Signed and Sealed this
Seventeenth Day of December, 2013

Margaret A. Focarino
*Commissioner for Patents of the United States Patent and Trademark Office*